United States Patent
Del Gatto et al.

(10) Patent No.: US 12,105,971 B2
(45) Date of Patent: Oct. 1, 2024

(54) DUAL-LEVEL REFRESH MANAGEMENT

(71) Applicant: Micron Technology, Inc., Boise, ID (US)

(72) Inventors: Nicola Del Gatto, Cassina de' Pecchi (IT); Niccolò Izzo, Vignate (IT)

(73) Assignee: Micron Technology, Inc., Boise, ID (US)

( * ) Notice: Subject to any disclaimer, the term of this patent is extended or adjusted under 35 U.S.C. 154(b) by 73 days.

(21) Appl. No.: 17/713,652

(22) Filed: Apr. 5, 2022

(65) Prior Publication Data

US 2023/0195337 A1    Jun. 22, 2023

Related U.S. Application Data

(60) Provisional application No. 63/292,644, filed on Dec. 22, 2021.

(51) Int. Cl.
*G06F 12/00* (2006.01)
*G06F 3/06* (2006.01)

(52) U.S. Cl.
CPC .......... *G06F 3/0632* (2013.01); *G06F 3/0604* (2013.01); *G06F 3/0679* (2013.01)

(58) Field of Classification Search
CPC ..... G06F 3/0632; G06F 3/0604; G06F 3/0679
See application file for complete search history.

(56) References Cited

U.S. PATENT DOCUMENTS

| | | | |
|---|---|---|---|
| 9,236,110 B2 | 1/2016 | Bains et al. | |
| 9,384,821 B2 | 7/2016 | Bains et al. | |
| 9,600,362 B2 | 3/2017 | Kang et al. | |
| 9,952,781 B2 | 4/2018 | Orme et al. | |
| 10,811,077 B2 | 10/2020 | Shin et al. | |
| 10,950,288 B2 | 3/2021 | Nale et al. | |
| 11,139,015 B2 | 10/2021 | Brown et al. | |
| 2014/0006704 A1* | 1/2014 | Greenfield | G06F 11/004 711/106 |
| 2015/0092508 A1* | 4/2015 | Bains | G11C 11/40611 365/222 |
| 2015/0279441 A1* | 10/2015 | Greenberg | G11C 11/406 365/49.1 |
| 2020/0201776 A1* | 6/2020 | Isenegger | G06F 12/0879 |

OTHER PUBLICATIONS

Improving DRAM Performance by Parallelizing Refreshes with Accesses', IEEE, 2017, pp. 1-13 (Year: 2017).*
Graphene: Strong yet Lightweight Row Hammer Protection', 2020, IEEE, pp. 1-13 (Year: 2020).*

* cited by examiner

*Primary Examiner* — Arvind Talukdar
(74) *Attorney, Agent, or Firm* — Brooks, Cameron & Huebsch, PLLC (57) ABSTRACT

Methods, systems, and devices related to determining whether a target address of a memory array associated with an access request is stored in a CAM. If the target address is stored in the CAM, the CAM may be updated to increment an access count of a target row corresponding to the target address. If the target row exceeds a first threshold value, rows of the memory array directly adjacent to the target row may be refreshed. If the target address is not stored in the CAM, the target address may be written to the CAM. The CAM may be updated to increment an access count of an address of a bank including the target row corresponding to the target address.

20 Claims, 4 Drawing Sheets

DUAL-LEVEL REFRESH MANAGEMENT

PRIORITY INFORMATION

This application claims the benefit of U.S. Provisional Application Ser. No. 63/292,644, filed on Dec. 22, 2021, the contents of which are incorporated herein by reference.

TECHNICAL FIELD

The present disclosure relates generally to semiconductor memory and methods, and more particularly, to apparatuses, systems, and methods of dual-level ReFresh Management (RFM).

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes Random Access Memory (RAM), Dynamic Random Access Memory (DRAM), Static Random Access Memory (SRAM), Synchronous Dynamic Random Access Memory (SDRAM), and Thyristor Random Access Memory (TRAM), among others. Non-volatile memory can provide persistent data by retaining stored data when not powered and can include NAND flash memory, NOR flash memory, Ferroelectric Random Access Memory (FeRAM), and resistance variable memory such as Phase Change Random Access Memory (PCRAM), Resistive Random Access Memory (RRAM), and Magnetoresistive Random Access Memory (MRAM), such as Spin Torque Transfer Random Access Memory (STTRAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system. A controller may be used to manage the transfer of data, commands, and/or instructions between the host and the memory devices.

DETAILED DESCRIPTION

Systems, apparatuses, and methods related to dual-level ReFresh Management (RFM) are described. Refreshing rows of a memory array can be used to mitigate a rowhammer attack. As used herein, a "rowhammer attack" refers to a security exploit that may be initiated by nefarious entities that takes advantage of electrical interaction between memory cells of a memory array that may change data values stored by memory cells of adjacent memory rows not addressed by a memory access. A rowhammer attack can include a specially crafted memory access pattern that rapidly and repeatedly accesses a particular row of a memory array numerous times, for instance. Accessing the same row of a memory array (e.g., an attacked row) repeatedly in a short amount of time may corrupt data values stored by other rows of the memory array adjacent to the attacked row.

As used herein, "attacker row(s)" or "attacked row(s)" refer to one or more rows that undergo a rowhammer attack. As used herein, "victim row(s)" refer to one or more rows near and/or adjacent to one or more attacked rows. Data values stored in a victim row may be corrupted as result of a rowhammer attack such the victim row needs to be refreshed. Refreshing rows of a memory array adjacent to another row of the memory suspected or determined to be undergoing to a rowhammer attack (e.g., victim rows) can reduce, or eliminate, the risk of data values stored in those adjacent rows being corrupted and/or mitigating corrupted data values.

Some previous approaches to mitigating effects of a rowhammer attack via refreshing rows of a memory do not provide fine-grain tracking of a suspected rowhammer attack at a memory controller level. Further, some previous approaches do not provide provable protection and/or scalability against known rowhammer attacks. Some previous approaches may not detect rowhammer attacks accurately, resulting false positive indications of victim rows. Such previous approaches do not refresh only victim rows. Rather a broad swath of rows may be refreshed, which is an inefficient use of resources.

Some previous approaches to RFM may include a memory controller keeping track of activation (ACT) commands issued to banks of a memory device (tracking at a bank level). If the quantity of ACT commands reaches a threshold, such as a Rolling Accumulated ACT Initial Management Threshold (RAAIMT), then the bank may be refreshed. The row to be refreshed is selected by the memory device, such as by a local controller resident on the memory device. As used herein, "resident on" refers to something that is physically located on a particular component. The term "resident on" can be used interchangeably with other terms such as "deployed on" or "located on," herein.

If the RAAIMT of a bank is exceeded, then a command may be sent to the bank to refresh the row selected by the memory device. The memory device may select the row using a probabilistic tracking. However, if a rowhammer attack is sufficiently rapid and/or has sufficient bandwidth (e.g., the rowhammer attack repeats over a sufficient quantity of rows), then the row undergoing the rowhammer attack may be tracked with low probability. The tracking probability of a rowhammer attack decreases proportionally with an increase in the bandwidth of a rowhammer attack. Thus, some previous approaches to RFM are not scalable. As the size of memory arrays continues to increase, some previous approaches to RFM may not be practical and/or economical to implement, and/or may not provide sufficient mitigation of effects of rowhammer attacks. Furthermore, some previous approaches do not scale up with an increase in the bandwidth of a rowhammer attack.

Aspects of the present disclosure address the above and other deficiencies by providing dual-level RFM. "Dual-level" refers to row-level and bank-level tracking and/or refreshing provided by embodiments of the present disclosure. Some embodiments can include per-bank logic circuitry to track accesses (e.g., read, write) of rows of a memory array. Some embodiments can include a table for tracking respective access counts of rows (e.g., most recently accessed rows). If an access count for a row exceeds a threshold value (suggesting that the row is undergoing, or has undergone, a rowhammer attack), then rows adjacent to that row can be refreshed. The access count for that row can be reset (e.g., set to zero) in response to refreshing the row.

Some embodiments can include a table for tracking respective access counts for a bank of memory. If an access count for a bank exceeds a threshold value (suggesting that one or more rows of that bank is undergoing and/or have undergone a rowhammer attack), then that bank can be refreshed. The respective access counts for that bank and rows of that bank can be reset (e.g., set to zero) in refreshing the bank.

As used herein, the singular forms "a," "an," and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." As used herein, "coupled to" or "coupled with" generally refers to a connection between components, which can be an indirect communicative connection or direct communicative connection (e.g., without intervening components), whether wired or wireless, including connections such as electrical, optical, magnetic, and the like. The terms "data" and "data values" are used interchangeably herein and can have the same meaning, as appropriate to the context.

The figures herein follow a numbering convention in which the first digit or digits correspond to the drawing figure number and the remaining digits identify an element or component in the drawing. Similar elements or components between different figures may be identified by the use of similar digits. For example, element 122 can represent element 22 in FIG. 1, and a similar element can be labeled 222 in FIG. 2. Analogous elements within a figure may be referenced with a hyphen and extra numeral or letter. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

Figure 1:
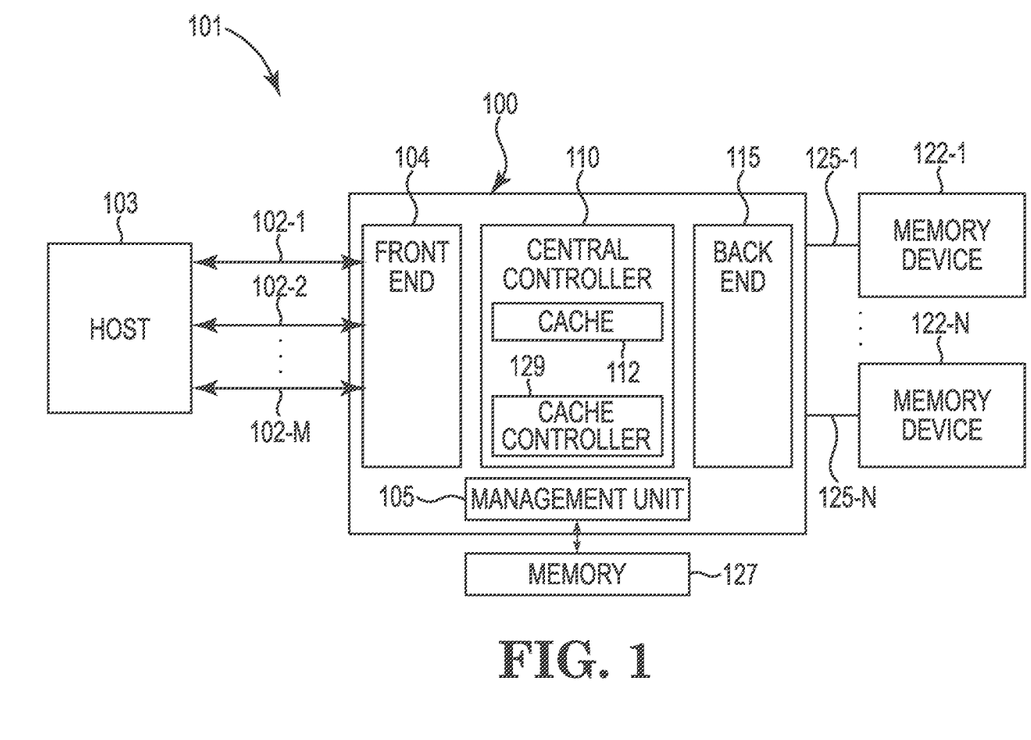
FIG. 1 illustrates a functional block diagram in the form of a computing system including a controller for dual-level RFM in accordance with a number of embodiments of the present disclosure.

FIG. 1 illustrates a functional block diagram in the form of a computing system 101 including a controller 100 for dual-level RFM in accordance with a number of embodiments of the present disclosure. The memory controller 100 can include a front end portion 104, a central controller portion 110, and a back end portion 115. The computing system 101 can further include a host 103, memory devices 122-1, . . . , 122-N (collectively referred to as memory devices 122), and a memory 127. The memory 127 can be a flash memory accessible via a serial peripheral interface (SPI). The memory 127 can include other circuitry, firmware, software, or the like, whether alone or in combination.

The front end portion 104 includes an interface to couple the memory controller 100 to the host 103 through input/output (I/O) lanes 102-1, 102-2, . . . , 102-M (collectively referred to as I/O lanes 102). The front end portion includes interface management circuitry to manage the I/O lanes 102. The front end portion can include any quantity of the I/O lanes 102 (e.g., eight, sixteen I/O lanes 102). In some embodiments, the I/O lanes 102 can be configured as a single port. In some embodiments, the interface between the memory controller 100 and the host 103 can be a Peripheral Component Interconnect express (PCIe) physical and electrical interface operated according to a Compute Express Link (CXL) protocol.

In some embodiments, the computing system 101 can be a CXL compliant memory system (e.g., the memory system can include a PCIe/CXL interface). CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost.

CXL is designed to be an industry open standard interface for high-speed communications, as accelerators are increasingly used to complement CPUs in support of emerging applications such as artificial intelligence and machine learning. CXL technology is built on the peripheral component interconnect express (PCIe) infrastructure, leveraging PCIe physical and electrical interfaces to provide advanced protocol in areas such as I/O protocol, memory protocol (e.g., initially allowing a host to share memory with an accelerator), and coherency interface.

The central controller portion 110 includes a cache memory 112 (alternatively referred to as a cache). In some embodiments, in response to receiving a read request for data stored in the cache memory 112, the data can be provided to the host 103 as requested without further accessing the memory device 122. In some embodiments, in response to receiving a write request, data can be stored in the cache memory 112 prior to writing the data to the memory device 122.

The central controller portion 110 can control, in response to receiving a memory access request from the host 103, for example, performance of one or more memory operations. Non-limiting examples of memory operations include a memory operation to read data from the cache memory 112 and/or a memory device 122 and an operation to write data to the cache memory 112 and/or a memory device 122. In some embodiments, the central controller portion 110 can control writing of multiple pages of data substantially simultaneously.

As used herein, the term "substantially" intends that the characteristic may not be absolute, but is close enough so as to achieve the advantages of the characteristic. For example, "substantially simultaneously" is not limited to operations that are performed absolutely simultaneously and can include timings that are intended to be simultaneous but due to manufacturing limitations may not be precisely simultaneously. For example, due to read/write delays that may be exhibited by various interfaces, media controllers that are utilized "substantially simultaneously" may not start or finish at exactly the same time. For example, the multiple memory controllers can be utilized such that they are writing data to the memory devices at the same time regardless if one of the media controllers commences or terminates prior to the other.

The back end portion 115 can include media control circuitry and a physical (PHY) layer that couples the memory controller 100 to the memory devices 122. As used herein, the term "PHY layer" generally refers to the physical layer in the Open Systems Interconnection (OSI) model of a computing system. The PHY layer can be the first (e.g., lowest) layer of the OSI model and used to transfer data over a physical data transmission medium. In some embodiments, the physical data transmission medium can include channels 125-1, . . . , 125-N (collectively referred to as the channels 125). The channels 125 can include a sixteen-pin data bus and a two pin data mask inversion (DMI) bus, for example, among other possible buses. The back end portion 115 can communicate (e.g., transmit and/or receive) data to and/or from the memory devices 122 via the data pins. Error detection information and/or error correction information can be communicated to and/or from the memory devices 122 via the DMI bus. Error detection information and/or error correction information can be communicated contemporaneously with the exchange of data.

An example of the memory devices 122 is dynamic random access memory (DRAM). DRAM can be operated according to a protocol, such as low-power double data rate (LPDDRx), (e.g., LPDDRx DRAM devices, LPDDRx memory, etc). The "x" in LPDDRx refers to any of a number of generations of the protocol (e.g., LPDDR5). In some embodiments, at least one of the memory devices 122 is operated as an LPDDRx DRAM device with low-power features enabled and at least one of the memory devices 122 is operated as an LPDDRx DRAM device with at least one low-power feature disabled. In some embodiments, the memory devices 122 are LPDDRx memory devices, but the memory devices 122 do not include circuitry configured to provide low-power functionality, such as a dynamic voltage frequency scaling core (DVFSC), a sub-threshold current reduce circuit (SCRC), or other low-power functionality providing circuitry. The LPDDRx memory devices 122 without such circuitry can advantageously reduce the cost, size, and/or complexity of the LPDDRx memory devices 122. By way of example, an LPDDRx memory device with reduced low-power functionality providing circuitry can be used for applications other than mobile applications (e.g., if the memory is not intended to be used in a mobile application, some or all low-power functionality can be sacrificed for a reduction in the cost of producing the memory).

In some embodiments, the memory controller 100 can include a management unit 105 to initialize, configure, and/or monitor characteristics of the memory controller 100. The management unit 105 can include an I/O bus to manage out-of-band data and/or commands, a management unit controller to execute instructions associated with initializing, configuring, and/or monitoring the characteristics of the memory controller, and a management unit memory to store data associated with initializing, configuring, and/or monitoring the characteristics of the memory controller 100. As used herein, the term "out-of-band data and/or commands" generally refers to data and/or commands transferred through a transmission medium that is different from the main transmission medium of a network. For example, out-of-band data and/or commands can be data and/or commands transferred to a network using a different transmission medium than the transmission medium used to transfer data within the network.

In some embodiments, the management unit 105 can be configured to provide dual-level RFM in accordance with the present disclosure. However, embodiments of the present disclosure are not so limited. For example, other portions, components, and/or circuitry of the memory controller 100 can be configured to provide dual-level RFM, individually or in combination, in accordance with the present disclosure. Example components of the memory controller 100 to provide dual-level RFM are described in association with FIG. 2.

The management unit 105 can store respective access counts of row addresses of memory arrays of the memory devices 122. The management unit 105 can store respective access counts of banks of the memory devices 122. The management unit 105 can, in response to an access count of a row address exceeding a threshold value, issue, or cause to be issued, one or more refresh commands to refresh at least one of the rows directly adjacent to a row corresponding to the row address. The management unit 105 can, in response to an access count of a bank exceeding a threshold value, issue, or cause to be issued, one or more refresh commands to refresh the bank. The threshold value for access counts of a row can be the same as or different than the threshold value for access counts of a bank.

Respective access counts can be stored in a content addressable memory (CAM) of the memory controller 100, which can be indexed by row addresses. The management unit 105 can determine whether a target row address associated with an access request is stored in the CAM. The management unit 105 can, in response to the target row address being stored in the CAM and an access count of the target row address exceeding the threshold value, issue, or cause to be issued, one or more refresh commands to refresh rows directly adjacent to the row corresponding to the target row address. In some embodiments, the management unit 105 can, in response to the target row address being stored in the CAM and the access count of the target row address exceeding the threshold value, a refresh command to refresh an additional row adjacent to the row corresponding to the target row address (e.g., a row not directly adjacent to the row corresponding to the target row address).

The management unit 105 can increment the access count of the target row address in response to determining that the target row address is stored in the CAM. The management unit 105 can, in response to determining that the target row address is not stored in the CAM, write the target row address to the CAM with an access count of 1. The management unit 105 can, in response to an access count of a bank including the target row address exceeding the threshold value for banks, issue, or cause to be issued, refresh commands to refresh the bank including the target row address. The management unit 105 can, in response to refreshing the bank including the target row address, reset the access count of the bank (e.g., to zero) and reset respective access counts of row addresses of the bank (e.g., to zero). The management unit 105 can, in response to determining that the target row address is not stored in the CAM, evict a Least Recently Used (LRU) entry from the CAM. The management unit 105 can increment the access count of the bank by an access count of the evicted entry.

Figure 2:
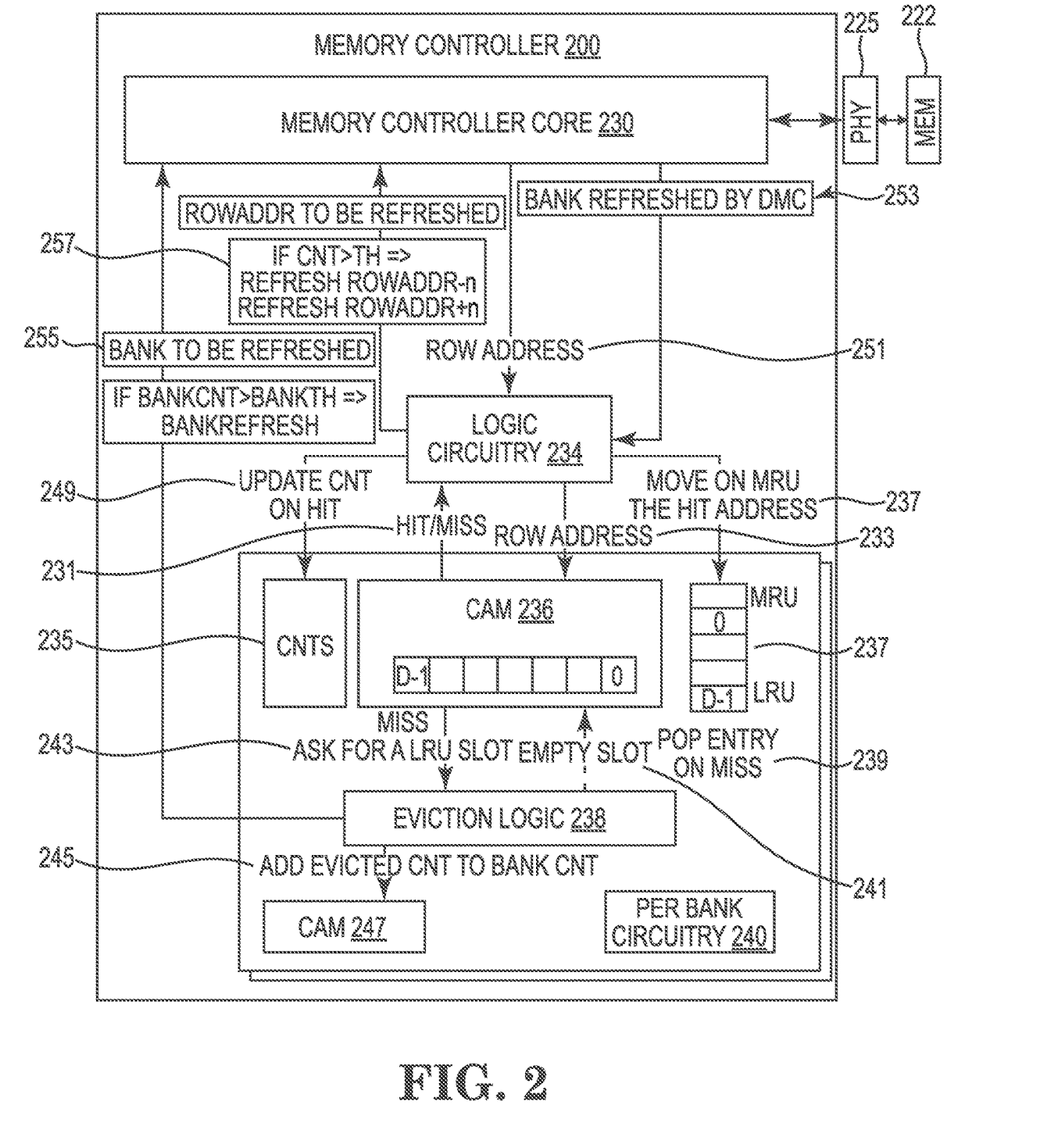
FIG. 2 illustrates a functional block diagram in the form of a memory controller for dual-level RFM in accordance with a number of embodiments of the present disclosure.

FIG. 2 illustrates a functional block diagram in the form of a memory controller 200 for dual-level RFM in accordance with a number of embodiments of the present disclosure. The memory controller 200, channels 225, and memory devices 222 can be analogous to the memory controller 100, channels 125, and memory devices 122, respectively, described in association with FIG. 1. Although not illustrated as such in FIG. 2, the respective components described in association with FIG. 2 can be components of the central controller portion 110 and/or the management unit 105.

FIG. 2 illustrates dual-level RFM by the memory controller 200. Although FIG. 2 illustrates only one rectangle representing the memory devices 222, the rectangle is representative of one or more memory devices 222. The memory devices 222 are coupled to the memory controller 200 by the channels 225. The channels 225 are part of the PHY layer.

The memory controller 200 includes a CAM 236 indexed by row addresses of the memory devices 222. Each entry of the CAM 236 can store a respective access count of the row address by which the entry is indexed. When a row of the memory devices 222 is accessed, the access count of the row address of that row can be incremented.

In response to the memory controller 200 issuing an access request (e.g., an access command), as illustrated at 251, a row address (e.g., a target row address) associated with the access request can be communicated by a memory controller core 230 to logic circuitry 234 of the memory controller 200. The logic circuitry 234 can be configured to determine whether the CAM 236 includes an entry indexed by the target row address. For example, as illustrated at 233, the logic circuitry 234 can provide the target row address to the CAM 236 to lookup the target row address. If the CAM 236 includes an entry indexed by the target row address, then the logic circuitry 234 can receive signaling indicative of a hit as illustrated at 231. If the CAM 236 does not include an entry indexed by the target row address, then the logic circuitry 234 can receive signaling indicative of a miss as illustrated at 231.

If the CAM 236 includes an entry indexed by the target row address, then, as illustrated at 249, the logic circuitry 234 updates, or causes to be updated, the entry of the CAM 236 indexed by the target row address to increment the corresponding access count. The access counts stored by the CAM 236 are represented by the rectangle 235. If the CAM 236 includes an entry indexed by the target row address, then, as illustrated at 237, the logic circuitry 234 can update, or cause to be updated, the CAM 236 to move the entry indexed by the target row address to a most recently used (MRU) slot of the CAM 236. The organization of the entries of the CAM 236 from the MRU slot to a least recently used (LRU) slot is represented at 237. The logic circuitry 234 can be configured to determine whether the access count of the target row address exceeds a threshold value. Non-limiting examples of a threshold value include access counts of 40 to 2000 accesses of the target row.

If the access count exceeds the threshold value, then, as illustrated at 257, then the logic circuitry 234 can provide signaling to the memory controller core 230 indicative of one or more refresh commands. The memory controller core 230 can communicate the refresh commands to the memory devices 222. The refresh commands are associated with row addresses adjacent to the target row address (e.g., RowAddr+n, RowAddr−n). As described herein, a rowhammer attack can span multiple rows (more than one attacker row). Which row addresses that are to be refreshed (target row addresses) can be based on the bandwidth of a rowhammer attack. In some embodiments, different quantities of adjacent row addresses on either side of the target row address (e.g., RowAddr+2, RowAddr−1).

In some embodiments, the logic circuitry 234 can be configured to determine a bandwidth of a suspected rowhammer attack based on an access pattern. The organization of the entries of the CAM 236 can be indicative of an access pattern. For example, if the access pattern is indicative of a single rowhammer attack in which a single row address (e.g., a target row address) is accessed repeatedly, then the logic circuitry 234 can provide signaling to the memory controller core 230 to refresh rows of the memory devices 222 directly adjacent to the row corresponding to the target row address (e.g., RowAddr−1, RowAddr+1). If the access pattern is indicative of a double rowhammer attack in which two row addresses (e.g., target row addresses) are accessed alternately and repeatedly, then the logic circuitry 234 can provide signaling to the memory controller core 230 to not only refresh rows of the memory devices 222 directly adjacent to the rows corresponding to the target row addresses (e.g., RowAddr−1, RowAddr+1), but also rows of the memory devices 222 adjacent, but not directly adjacent, to the rows corresponding to the target row addresses (e.g., RowAddr−2, RowAddr+2).

If the CAM 236 does not includes an entry indexed by the target row address, then the logic circuitry 234 updates, or causes to be updated, the CAM 236 to include an entry indexed by the target row address. The access count of that entry is set to an initial value (e.g., one). The newly written entry can be written to an MRU slot of the CAM 236. As illustrated by FIG. 2, the memory controller 200 can include eviction logic circuitry 238. If the CAM 236 does not includes an entry indexed by the target row address and the CAM 236 is full, then, as illustrated at 243, the CAM 236 can provide signaling to the eviction logic circuitry 238 to ask for the entry at the LRU slot. As illustrated at 239, the LRU entry of the CAM 236 can be evicted ("popped") from the CAM 236.

As illustrated by FIG. 2, the memory controller 200 can include a CAM 247 that is indexed by one or more bank addresses of the memory devices 222. The CAM 247 can include circuitry to perform a lookup on an index of the CAM 247. Although not illustrated by FIG. 2, in some embodiments, the memory controller 200 can include a respective counter for each bank to track accesses to the banks. The access counts for one or more banks can be stored in an SRAM, for example. Each entry of the CAM 247 can store a respective access count of the bank address (e.g., BankCnt described in association with FIG. 3A) by which the entry is indexed. The CAM 247 can be referred to as a global CAM. In response to evicting an entry from the CAM 236, the eviction logic circuitry 238 can update, or cause to be updated, an entry of the CAM 247 indexed by a bank address that includes the target row address with the access count of the evicted entry. The access count of the evicted entry can be added to the access count of the bank address that includes the target row address.

The eviction logic circuitry 238, or the logic circuitry 234, can be configured to determine whether the access count of the bank address that includes the target row address exceeds a threshold value. A non-limiting example of such a threshold value is a RAAIMT. The threshold value for bank addresses can be different than the threshold value for row addresses. If the access count of the bank address exceeds the threshold value, then, as illustrated at 255, then the eviction logic circuitry 238 can provide signaling to the memory controller core 230 indicative of one or more bank refresh commands. The memory controller core 230 can communicate the bank refresh commands to the memory devices 222. As illustrated at 253, the memory controller core 230 can provide signaling to the logic circuitry 234 indicative of the execution of the bank refresh.

As illustrated by FIG. 2, in some embodiments, the memory controller 200 can include per bank circuitry 240. The memory controller 200 can include respective instances of the CAM 236, the eviction logic circuitry 238, and the CAM 247 for one or more banks of the memory devices 222. In some embodiments, instead of providing refresh commands as described herein, the memory controller core 230 can communicate read commands to the memory devices 222, but ignore and/or discard responses from the memory devices 222 resulting from the read commands.

Figures 3A, 3B:
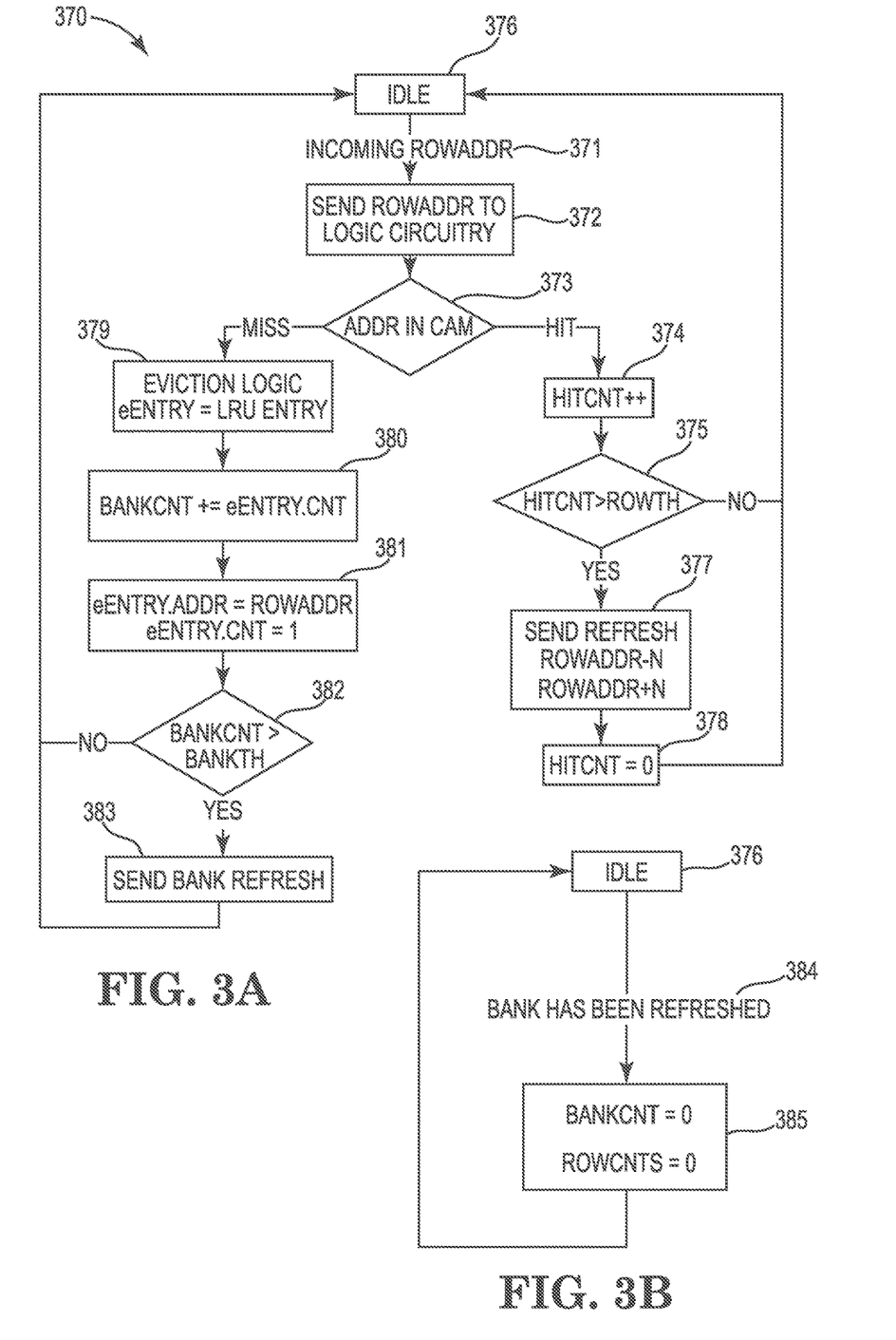
FIGS. 3A-3B are a flow diagram of dual-level RFM in accordance with a number of embodiments of the present disclosure.

FIGS. 3A-3B are a flow diagram 370 of dual-level RFM in accordance with a number of embodiments of the present disclosure. Any of the steps and operations of the flow diagram 370 can be performed by the memory controller 100 and/or the memory controller 200 described in association with FIGS. 1 and 2, respectively.

As illustrated by FIG. 3A, dual-level RFM according to the flow diagram 370 can begin, at 371, with receiving a target row address (RowAddr) associated with an access request. At 372, the target row address can be communicated to logic circuitry, such as the logic circuitry 234 described in association with FIG. 2. At 373, the logic circuitry can determine whether the target row address is stored in a CAM, such as the CAM 236.

If the target row address is stored in the CAM, then, at 374, the entry of the CAM indexed by the target row address is updated to increment the access count (HitCnt) of the target row address. At 375, whether the access count exceeds a threshold value (RowTH) is determined. The logic circuitry can determine whether the access count exceeds the threshold value. If the access count does not exceed the threshold value, then the flow diagram 370 idles at 376. If the access count exceeds the threshold value, then, at 377, refresh commands associated with row addresses adjacent to the target row address (e.g., RowAddr-n, RowAddr+n) are communicated to a memory array or memory device, such as the memory devices 122 or 222. Then, at 378, the entry of the CAM indexed by the target row address is updated to reset the access count (HitCnt) of the target row address to zero.

If, at 373, the target row address is not stored in the CAM, then, at 379, the entry of the CAM in the LRU slot of the CAM is designated for eviction from the CAM (eEntry=LRU Entry). Eviction logic circuitry, such as the eviction logic circuitry 238, can evict (remove) the entry from the CAM. At 380, the access count of a bank address (BankCnt) including the row corresponding to the target row address is incremented by the access count of the evicted entry (eEntry.Cnt). At 381, an entry indexed by the target row address is written to the CAM with an access count of one. At 382, whether the access count of the bank exceeds a threshold value (BankTH) is determined. The logic circuitry or the eviction logic circuitry can determine whether the access count exceeds the threshold value. If the access count does not exceed the threshold value, then the flow diagram 370 idles at 376. If the access count exceeds the threshold value, then, at 383, a bank refresh command associated with the bank including the row corresponding to the target row address is communicated to the memory array or memory device.

As illustrated by FIG. 3B, in response to, at 384, the bank including the row corresponding to the target row address being refreshed, at 385, entries of the CAM indexed by row addresses corresponding to rows of the refreshed bank are updated to reset the access counts (RowCnts) to zero. Additionally, the access count of the refreshed bank is reset to zero.

Figure 4:
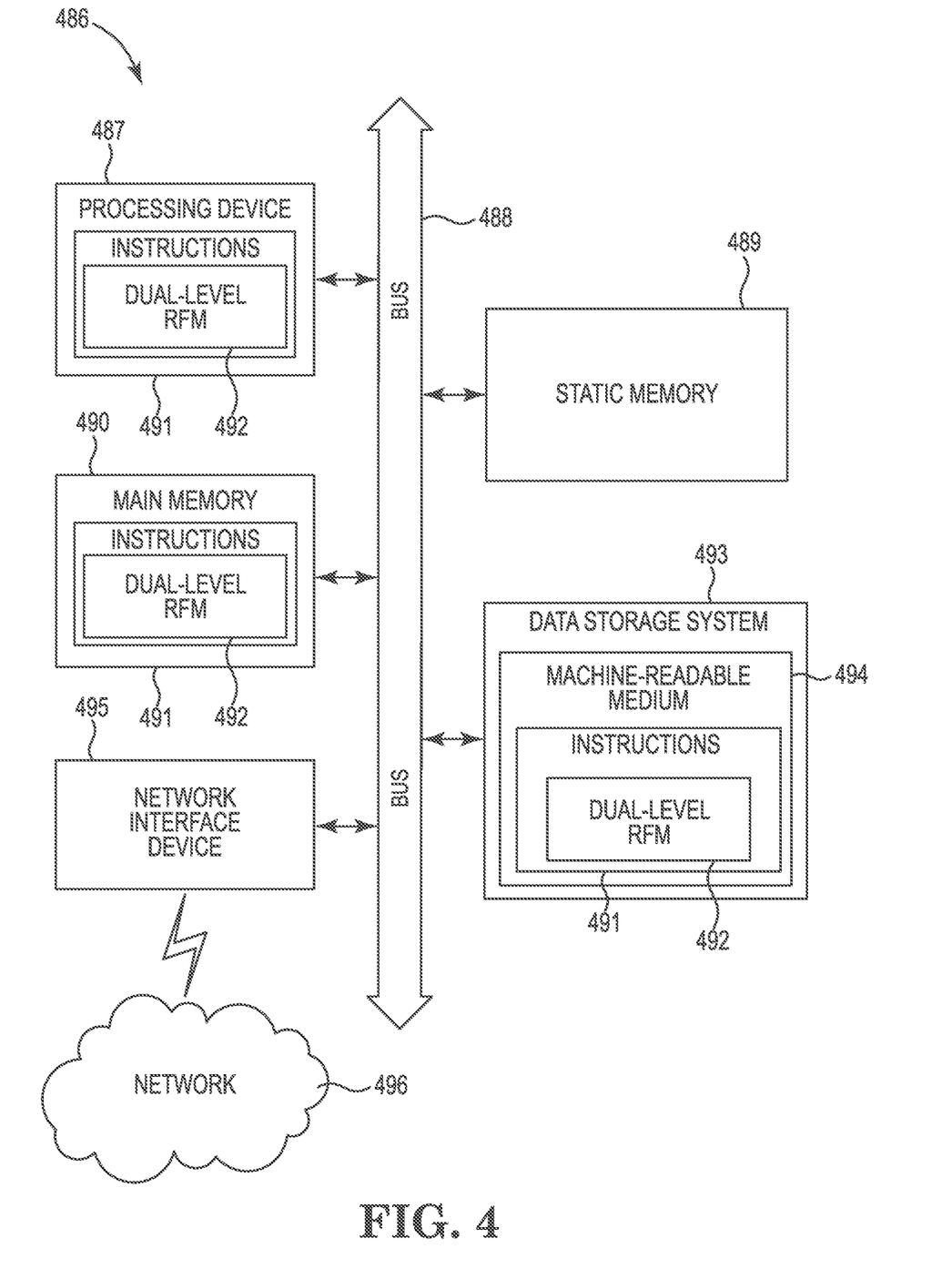
FIG. 4 is a block diagram of a computer system for dual-level RFM in accordance with a number of embodiments of the present disclosure.

FIG. 4 is a block diagram of a computer system 486 for dual-level RFM in accordance with a number of embodiments of the present disclosure. The computer system 486 can be a machine within which a set of instructions, for causing the machine to perform any one or more of the methodologies discussed herein, can be executed. In some embodiments, the computer system 486 can correspond to a host (e.g., the host 103 described in association with FIG. 1) that includes, is coupled to, or utilizes one or more memory devices (e.g., the memory devices 122) or can be used to perform the operations of a controller (e.g., the memory controller 100) to execute an operating system to perform operations associated with dual-level RFM. In alternative embodiments, the machine can be connected (e.g., networked) to other machines in a local access network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The computer system 486 includes a processing device 487, a main memory 490 (e.g., ROM, flash memory, DRAM such as synchronous DRAM (SDRAM) or Rambus DRAM (RDRAM), etc.), a static memory 489 (e.g., flash memory, SRAM, etc.), and a data storage system 493, which communicate with each other via a bus 488.

The processing device 487 represents one or more general-purpose processing devices such as a microprocessor, a central processing unit, or the like. More particularly, the processing device 487 can be a Complex Instruction Set Computing (CISC) microprocessor, Reduced Instruction Set Computing (RISC) microprocessor, Very Long Instruction Word (VLIW) microprocessor, or a processor implementing other instruction sets, or processors implementing a combination of instruction sets. The processing device 487 can also be one or more special-purpose processing devices such as an Application Specific Integrated Circuit (ASIC), a Field Programmable Gate Array (FPGA), a Digital Signal Processor (DSP), network processor, or the like. The processing device 487 is configured to execute instructions 491 for performing the operations and steps discussed herein. The computer system 486 can further include a network interface device 495 to communicate over the network 496.

The data storage system 493 can include a machine-readable storage medium 494 (also referred to as a computer-readable medium) on which one or more sets of instructions 491 or software embodying any one or more of the methodologies or functions described herein is stored. The instructions 491 can also reside, completely or at least partially, within the main memory 490 and/or within the processing device 487 during execution thereof by the computer system 486, the main memory 490, and the processing device 487 also constituting machine-readable storage media. In some embodiments, the machine-readable storage medium 494, data storage system 493, and/or main memory 490 can correspond to the memory devices 122.

In some embodiments, the instructions 491 can include instructions to implement functionality for dual-level RFM (represented in FIG. 4 at 492). For instance, the instructions 491 can include instructions to store respective access counts of row addresses of a memory array and store respective access counts of banks of a memory device, wherein one of the banks includes the memory array. The instructions 491 can include instructions to, responsive to an access count of a row address exceeding a first threshold value, refresh a first row of the memory array directly adjacent to a second row of the memory array corresponding to the row address and, responsive to an access count of a bank exceeding a second threshold value, refresh the bank.

The instructions 491 can include instructions to store the respective access counts in CAM indexed by the plurality of row addresses and determine whether a target row address of the memory array associated with an access request is stored in the CAM. The instructions 491 can include instructions to, responsive to the target row address being stored in the CAM and an access count of the target row address exceeding the first threshold value, refresh rows of the memory array directly adjacent to a row of the memory array corresponding to the target row address. The instructions 491 can include instructions to, responsive to the target row address being stored in the CAM and the access count of the target row address exceeding the first threshold value, refresh an additional row of the memory array adjacent to the row of the memory array corresponding to the target row address. The instructions 491 can include instructions to, responsive to determining that the target row address is stored in the CAM, increment the access count of the target row address. The instructions 491 can include instructions to, responsive to determining that the target row address is not stored in the CAM, write the target row address to the CAM with an access count of 1 and, responsive to an access count of a bank including the target row address exceeding the second threshold value, refresh the bank including the target row address.

The instructions 491 can include instructions to, responsive to refreshing the bank including the target row address, reset the access count of the bank and reset respective access counts of row addresses of the bank. The instructions 491 can include instructions to responsive to determining that the target row address is not stored in the CAM, evict a LRU entry from the CAM. The instructions 491 can include instructions to, responsive to evicting the LRU entry from the CAM, incrementing the access count of the bank by an access count of the evicted entry.

Although the machine-readable storage medium 494 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   determining whether a target address of a memory array associated with an access request is stored in a Content Addressable Memory (CAM);
   in response to determining the target address is stored in the CAM:
      updating the CAM to increment a row access count associated with a target row corresponding to the target address; and
      determining whether the row access count exceeds a threshold value of accesses to the target row, wherein a refresh command associated with a row address adjacent the target row is sent to the memory array and an entry of the CAM is updated to reset the access count of the target row in response to determining the row access count does not exceed the threshold value of accesses to the target row; and
   in response to determining that the target address is not stored in the CAM:
      updating the CAM to increment a bank access count associated with an address of a bank including the target row corresponding to the target address, wherein the bank includes multiple rows;
      writing an entry to the CAM; and
      determining whether the bank access count exceeds a threshold value of accesses to the bank, wherein a bank refresh command associated with the bank that includes the row corresponding to the target address is sent to the memory array and the row corresponding to the target address being refreshed is reset in response to determining the access count exceeds the threshold value of accesses to the bank.

2. The method of claim 1, further comprising, in response to the access count associated with the target row exceeding the threshold value of accesses to the target row, updating the CAM to reset the access count associated with the target row to zero.

3. The method of claim 1, further comprising, in response to refreshing the bank including the target row:
   updating the CAM to reset the access count associated with the address of the bank including the target row to zero, and
   updating the CAM to reset respective access counts associated with addresses of rows of the bank including the target row to zero.

4. The method of claim 1, further comprising, in response to determining that the target address is not stored in the CAM, and determining at t the CAM is full, evicting a least recently used (LRU) entry from the CAM.

5. The method of claim 1, further comprising, in response to determining that the target address is not stored in the CAM, and determining that the CAM is not full, writing the target address to a most recently used (MRU) slot of the CAM.

6. An apparatus, comprising:
control circuitry comprising a Content Addressable Memory (CAM) indexed by row addresses and storing respective row access counts,
wherein the control circuitry is configured to:
receive a target row address associated with an access request;
determine whether the CAM includes an entry indexed with the target row address;
in response to determining that the CAM includes an entry indexed with the target row address:
updating the CAM to increment a row access count associated with a target row corresponding to the target row address; and
determining whether the row access count exceeds a threshold value of accesses to the target row, wherein a refresh command associated with a row address adjacent the target row is sent to a memory array and an entry of the CAM is updated to reset the access count of the target row in response to determining the row access count does not exceed the threshold value of accesses to the target row; and
in response to determining that the target address is not stored in the CAM:
updating the CAM to increment a bank access count associated with an address of a bank including the target row corresponding to the target row address, wherein the bank includes multiple rows;
writing an entry to the CAM; and
determining whether the bank access count exceeds a threshold value of accesses to the bank, wherein a bank refresh command associated with the bank that includes the row corresponding to the target row address is sent to the memory array and the row corresponding to the target row address being refreshed is reset in response to determining the access count exceeds the threshold value of accesses to the bank.

7. The apparatus of claim 6, wherein the control circuitry further comprises logic circuitry configured to determine whether the value of the access count of the entry indexed with the target row address exceeds a threshold value of accesses to the target row.

8. The apparatus of claim 7, wherein:
the control circuitry further comprises a core coupled to the logic circuitry and configured to communicate refresh commands to memory devices, and
the logic circuitry is further configured to, in response to the value of the access count of the entry indexed with the target row address exceeding the threshold value of accesses to the target row, communicate, to the core, a row refresh command associated with row addresses directly adjacent to the target row address.

9. The apparatus of claim 8, wherein the logic circuitry is further configured to:
in response to the CAM not including an entry indexed with the target row address, write an entry indexed by the target row address to the CAM; and
in response to the CAM including an entry indexed with the target row address, updating the entry to increment the access count.

10. The apparatus of claim 6, wherein:
the control circuitry further comprises respective bank circuitry for each bank coupled thereto, and
each bank circuitry comprises a respective CAM indexed by row addresses of a corresponding bank and storing respective row access counts.

11. The apparatus of claim 10, wherein each bank circuitry further comprises:
a counter configured to track an access count of the corresponding bank; and
a Static Random Access Memory (SRAM) configured to store the access count of the corresponding bank.

12. The apparatus of claim 11, wherein:
each bank circuitry further comprises eviction logic circuitry coupled to the CAM and a different CAM, and
the eviction logic circuitry is configured to, in response to determining that the CAM does not include an entry indexed with the target row address, and determining that the CAM is full:
evict a Least Recently Used (LRU) entry of the CAM from the CAM; and
update the different CAM to increment the access count of the corresponding bank.

13. A non-transitory medium storing instructions executable by a processing device to:
store respective access counts of a plurality of row addresses of a memory array;
store respective access counts of a plurality of banks of a memory device, wherein one of the banks includes the memory array and each of the plurality of banks includes a respective plurality of row addresses;
determine whether a target address of the memory array associated with an access request is stored in a Content Addressable Memory (CAM);
in response to determining the target address is stored in the CAM:
update the CAM to increment a row access count associated with a target row corresponding to a target address; and
determine whether the row access count exceeds a threshold value of accesses to the target row, wherein a refresh command associated with a row address adjacent the target row is sent to the memory array and an entry of the CAM is updated to reset the access count of the target row in response to determining the row access count does not exceed the threshold value of accesses to the target row; and
in response to determining that the target address is not stored in the CAM:
update the CAM to increment a bank access count associated with an address of a bank including the target row corresponding to the target address, wherein the bank includes multiple rows;
write an entry the CAM; and
determining whether the bank access count exceeds a threshold value of accesses to the bank, wherein a bank refresh command associated with the bank that includes the row corresponding to the target row address is sent to the memory array and the row corresponding to the target row address being refreshed is reset in response to determining the access count exceeds the threshold value of accesses to the bank.

14. The medium of claim 13, further storing instructions executable to:
store the respective access counts in a Content Addressable Memory (CAM) indexed by the plurality of row addresses;

determine whether a target row address of the memory array associated with an access request is stored in the CAM; and responsive to the target row address being stored in the CAM and an access count of the target row address exceeding the threshold value of accesses to the target row address, refresh rows of the memory array directly adjacent to a row of the memory array corresponding to the target row address.

15. The medium of claim 14, further storing instructions executable to, responsive to the target row address being stored in the CAM and the access count of the target row address exceeding the threshold value accesses to the target row address, refresh an additional row of the memory array adjacent to the row of the memory array corresponding to the target row address.

16. The medium of claim 15, further storing instructions executable to, responsive to determining that the target row address is stored in the CAM, increment the access count of the target row address.

17. The medium of claim 14, further storing instructions executable to, responsive to determining that the target row address is not stored in the CAM:

write the target row address to the CAM with an access count of 1; and responsive to an access count of a bank including the target row address exceeding the threshold value of accesses to the bank, refresh the bank including the target row address.

18. The medium of claim 17, further storing instructions executable to, responsive to refreshing the bank including the target row address:

reset the access count of the bank; and reset respective access counts of row addresses of the bank.

19. The medium of claim 17, further storing instructions to, responsive to determining that the target row address is not stored in the CAM, and determining that the CAM is full, evict a Least Recently Used (LRU) entry from the CAM.

20. The medium of claim 19, further storing instructions to, responsive to evicting the LRU entry from the CAM, incrementing the access count of the bank by an access count of the evicted entry.

* * * * *